(12) United States Patent  (10) Patent No.: US 7,478,280 B2
Dean et al.  (45) Date of Patent: *Jan. 13, 2009

(54) TEST SYSTEM FOR INTEGRATED CIRCUITS

(75) Inventors: Alvar A. Dean, Essex Junction, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/955,433

(22) Filed: Dec. 13, 2007

(65) Prior Publication Data

US 2008/0091994 A1  Apr. 17, 2008

Related U.S. Application Data

(63) Continuation of application No. 09/394,302, filed on Sep. 10, 1999, now Pat. No. 7,350,108.

(51) Int. Cl.
*G06F 11/00* (2006.01)

(52) U.S. Cl. .......................... 714/27; 702/118; 206/706

(58) Field of Classification Search .................. 714/27; 206/706, 707, 723; 702/118; 324/513; 438/18
See application file for complete search history.

(56) References Cited

U.S. PATENT DOCUMENTS

| | | | |
|---|---|---|---|
| 3,494,459 A * | 2/1970 | Wallestad .................... 206/719 |
| 3,651,315 A | 3/1972 | Collins |
| 3,652,974 A * | 3/1972 | Tems .......................... 439/526 |
| 3,746,157 A * | 7/1973 | I'Anson ...................... 206/724 |
| 4,026,412 A | 5/1977 | Henson |
| 4,122,995 A | 10/1978 | Franke |
| 4,291,404 A | 9/1981 | Steiner |
| 4,329,642 A | 5/1982 | Luthi et al. |
| 4,483,441 A | 11/1984 | Akizawa et al. |
| 4,559,626 A | 12/1985 | Brown |
| 4,593,820 A | 6/1986 | Antonie et al. |
| 4,639,664 A | 1/1987 | Chiu et al. |
| 4,690,275 A * | 9/1987 | Fritz .......................... 206/724 |
| 4,768,195 A | 8/1988 | Stoner et al. |
| 4,773,028 A | 9/1988 | Tallman |
| 4,845,843 A | 7/1989 | Babcock |
| 4,918,928 A | 4/1990 | Morioka et al. |
| 5,151,650 A | 9/1992 | Frisbie et al. |
| 5,180,974 A | 1/1993 | Mitchell et al. |
| 5,180,976 A * | 1/1993 | Van Loan et al. ........... 324/754 |
| 5,227,614 A | 7/1993 | Danielson et al. |
| 5,243,274 A | 9/1993 | Kelsey et al. |
| 5,339,262 A | 8/1994 | Rostoker et al. |
| 5,341,314 A | 8/1994 | Bencivenga et al. |
| 5,566,186 A | 10/1996 | Paterson et al. |
| 5,570,270 A | 10/1996 | Naedel et al. |

(Continued)

*Primary Examiner*—Gabriel L Chu
(74) *Attorney, Agent, or Firm*—Gibb & Rahman, LLC; Michael J. LeStrange, Esq.

(57) ABSTRACT

A test board includes a plurality of sockets for connection to a plurality of integrated circuit chips to be tested. A test control device on the board turns on at least one test engine for testing the plurality of chips simultaneously. A checking circuit verifies the functionality of each chip by comparing outputs of chips with each other or with a golden chip. Failing Chips are disconnected from further testing and passing or failing chips are recorded.

7 Claims, 7 Drawing Sheets

U.S. PATENT DOCUMENTS

| | | |
|---|---|---|
| 5,629,876 A | 5/1997 | Huang et al. |
| 5,640,337 A | 6/1997 | Huang et al. |
| 5,642,363 A | 6/1997 | Smith |
| 5,710,934 A | 1/1998 | Bona et al. |
| 6,031,386 A | 2/2000 | Cole, Jr. et al. |
| 6,037,796 A | 3/2000 | Graef et al. |
| 6,055,653 A | 4/2000 | LeBlanc et al. |
| 6,112,163 A | 8/2000 | Oowaki et al. |
| 6,119,225 A | 9/2000 | Kim |
| 6,163,145 A | 12/2000 | Yamada et al. |
| 6,195,616 B1 | 2/2001 | Reed et al. |
| 6,198,273 B1 | 3/2001 | Onishi et al. |
| 6,353,563 B1 | 3/2002 | Hii et al. |
| 6,452,411 B1 | 9/2002 | Miller et al. |
| 6,480,978 B1 | 11/2002 | Roy et al. |
| 6,499,121 B1 | 12/2002 | Roy et al. |
| 6,563,331 B1 * | 5/2003 | Maeng ........................ 324/760 |

* cited by examiner

CHECKER / COMPARATOR

TEST SYSTEM FOR INTEGRATED CIRCUITS

CROSS-REFERENCE TO RELATED APPLICATIONS

This application is a continuation of U.S. application Ser. No. 09/394,302 filed Sep. 10, 1999, the complete disclosure of which, in its entirety, is herein incorporated by reference.

BACKGROUND OF INVENTION

1. Field of the Invention

The present invention is generally related to testing systems for integrated circuits. It is also related to systems for parallel testing integrated circuit chips. It is more specifically related to an in-transit test system for testing application specific integrated circuits (ASICs).

2. Description of the Related Art

Application specific integrated circuits (ASICs) are customized circuits which are generally produced in limited numbers. Testing such circuits present problems because of the unique role each different ASIC batch is designed to perform.

More specifically, the design for an ASIC is usually supplied to a semiconductor foundry which manufactures individual chip packages. The chip packages are then to shipped to a different location such as a module build house, which packages the chips. The packaged chips are then shipped to a different location, usually back to the original foundry, to be tested. After being tested the non-defective chips are shipped to a different location such as the system house for system assembly.

The extra processing required to test the ASIC adds substantially to the cost of the product being produced and increases the time that it takes to bring a product to market. Further, conventional testing mechanisms generally comprise large multi-million dollar testing operations which are capable of performing the varied testing that the uniquely functioning ASICs require. Therefore, there is a need to reduce the time and resources devoted to testing ASIC products.

SUMMARY OF THE INVENTION

It is therefore an object of the present invention to provide a scheme for testing a plurality of integrated circuits at one time.

It is another object of the present invention to provide test stimuli in parallel to a plurality of chips circuits and to compare outputs of all chips in a single step as an indication of passing or failing.

It is yet another object of the present invention to distinguish passing and failing chips by comparing chip output data with data from a golden chip.

These and other objects of the invention are accomplished with a tester for testing a plurality of chips that comprises a test control device. The test control device turns on at least one test engine to provide test signal to the plurality of chips in parallel. A checking circuit compares output signal of the plurality of chips with each other. A golden output signal is used to replace defective output signal from a failing chip. The circuit is located local to said chips.

A control device verifies the functionality of each chip and records passing or failing chips. In one embodiment, the test control device operates while the tester is in transit. The checking circuit compares all the chips with each other. The tester also includes a visible indicator showing the passing or failing chips. The visible indicator could be a light or a register.

The chips are tested simultaneously and the outputs of the chips are compared to each other. Sockets for holding and contacting the chips, the test control device, the test engine, and the checking circuit can all be on a single card. Multiple cards can also be used. The test engine includes a BIST engine or read only memory with stored test patterns.

Another embodiment of the invention is a device for transporting integrated circuit chips that includes a test circuit connected to the integrated circuit chips. The test circuit tests the integrated circuit chips during transport. The device includes a power supply connected to the test circuit and an indicator for identifying which ones of the integrated circuit chips failed the testing. The indicator could be a memory such as a register or an LED. The test circuit includes a control device and connections between the control device and the integrated circuit chips.

Yet another embodiment of the invention is a method for testing integrated circuit chips which includes transporting the integrated circuit chips, testing the integrated circuit chips, supplying power to a test circuit connected to the integrated circuit chips during the transporting, and identifying which ones of the integrated circuit chips failed the testing. The identifying includes storing results of the testing in a memory or illuminating a light. The testing includes connecting the integrated circuit chips to a test circuit within a transportation device.

Yet another embodiment of the invention is a method of testing an integrated circuit chip. The method includes the steps of providing a golden chip; providing test patterns for testing the chip under test and for testing the golden chip; and comparing an output signal from the chip under test with an output signal from the golden chip to determine whether the chip under test passes or fails.

The invention provides a substantially simplified system for testing ASIC chips because the invention does not need to know the output a given input should produce. This is especially important in ASIC chip testing because each different design of ASIC chips has a potentially different output for a given input. Further, since the invention tests the chips during transit, the testing time does not add to the manufacturing time (assuming that the transportation time is longer than the testing time). Thus, the invention helps speed ASIC chip products to market by simplifying the testing process (and thereby reducing testing time) and by performing the testing during transit to further reduce overall processing time.

In addition, the invention saves test time by providing parallel testing of chips at wafer-test or at module test within the factory.

BRIEF DESCRIPTION OF THE DRAWINGS

The foregoing and other objects, aspects and advantages will be better understood from the following detailed description of preferred embodiments of the invention with reference to the drawings, in which:

FIG. 4b is a schematic diagram of a the checker/comparator circuit of FIG. 4a;

DETAILED DESCRIPTION OF THE INVENTION

Figure 1:
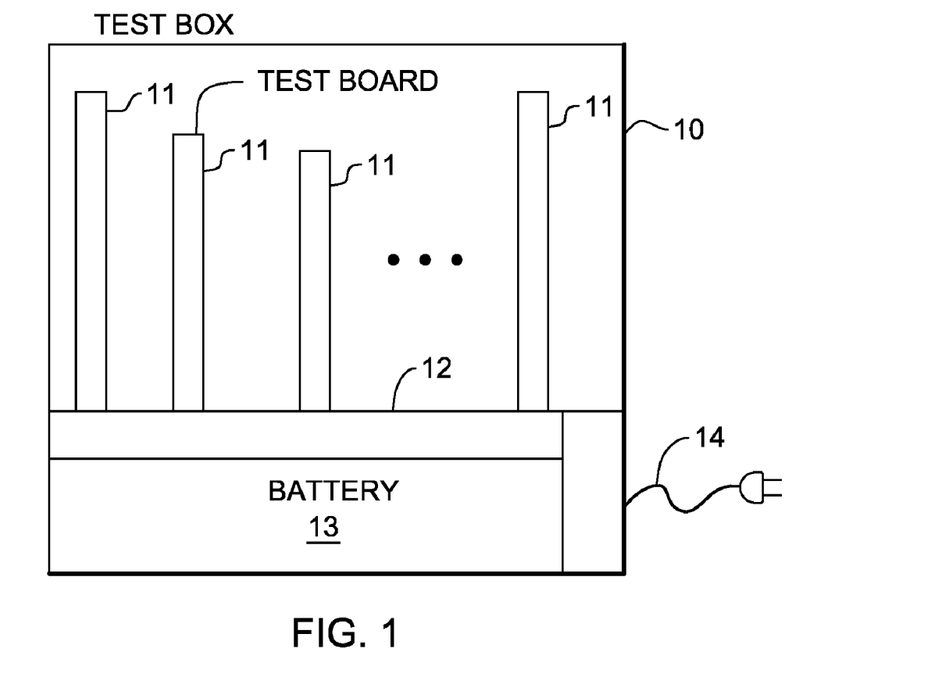
FIG. 1 is a schematic diagram of a test box comprising test boards of the present invention.

The invention includes the ability to test products while in transit. Test box 10 is shown in FIG. 1, including a plurality of test boards 11 connected to power supply bus 12 which is powered by a battery 13 or alternatively connected to an external power source by power leads 14.

Figure 2:
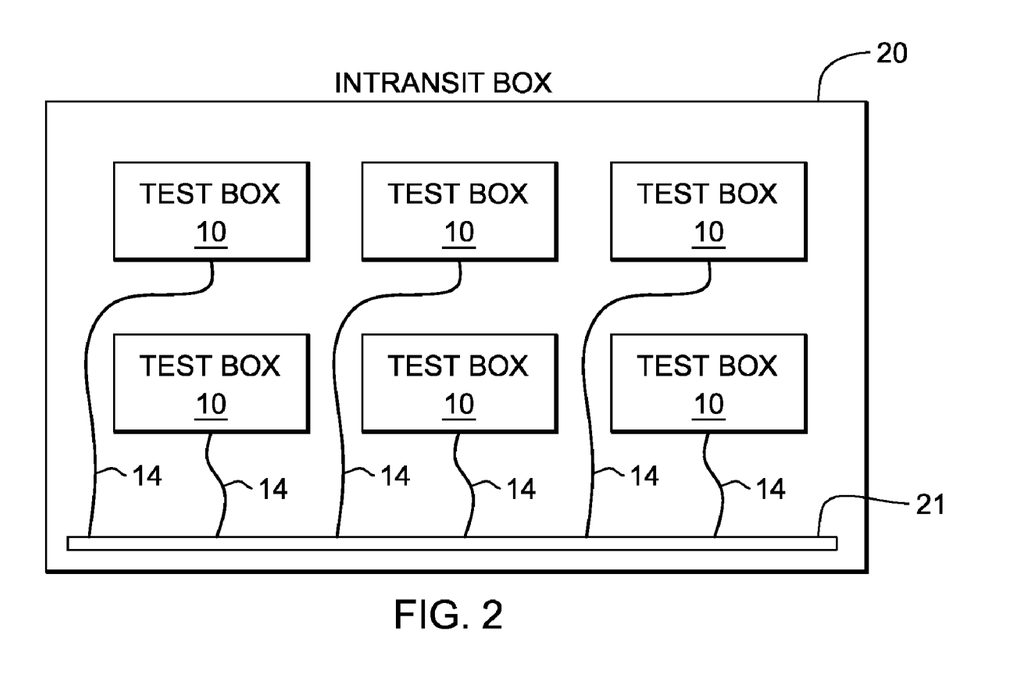
FIG. 2 is a schematic diagram of an in-transit box.

In-transit box 20 that includes multiple test boxes 10 as shown in FIG. 2. FIG. 2 also illustrates in-transit power bus 21 and power leads 14 supplying power to each individual test box 10 that are included in in-transit test box 20. A primary function of test box 10 and in-transit box 20 is to supply power to test boards 11 so that testing can occur during transit, thereby avoiding increasing manufacturing time for testing.

Figure 3:
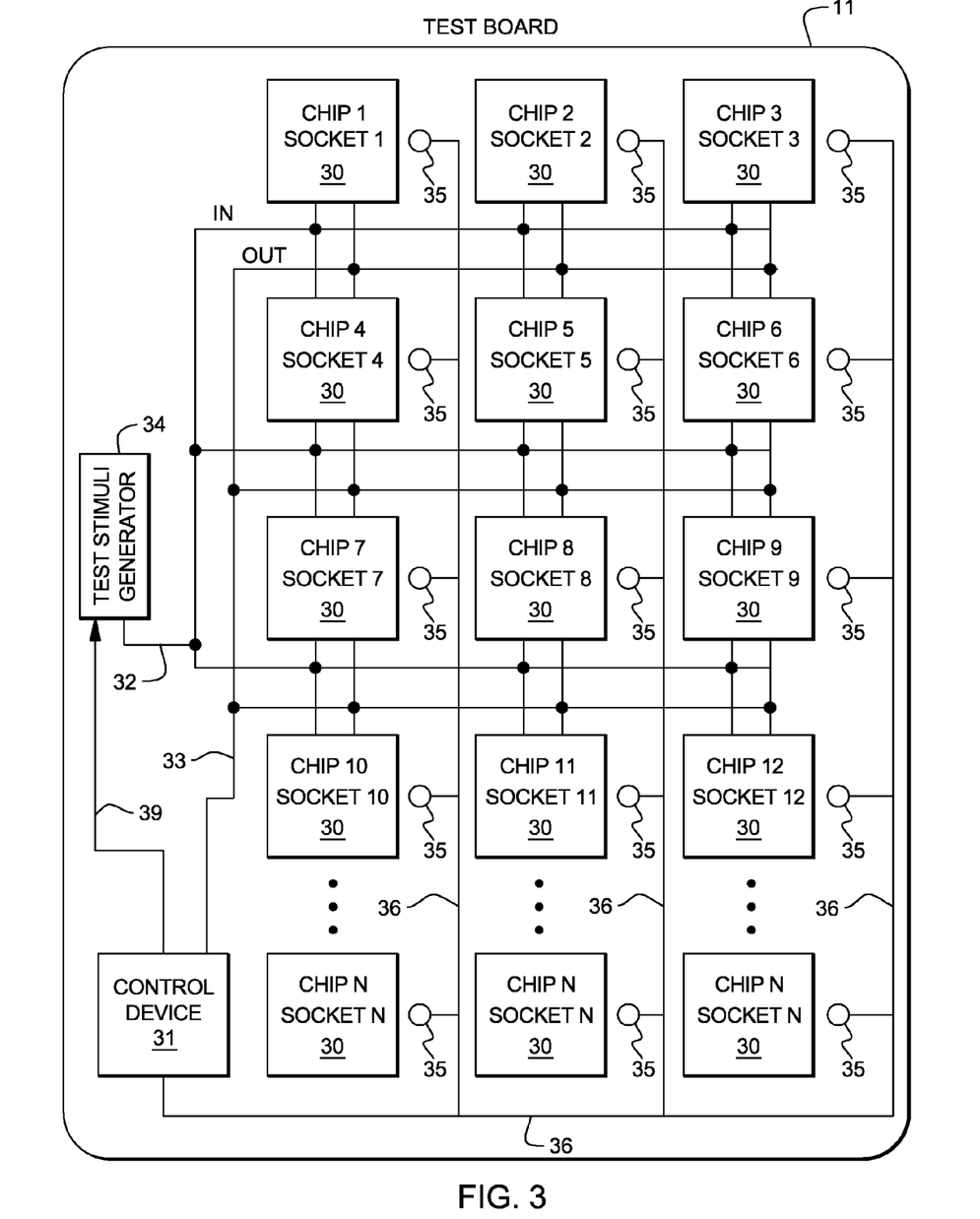
FIG. 3 is a schematic diagram of a test board.
Figure 4A:
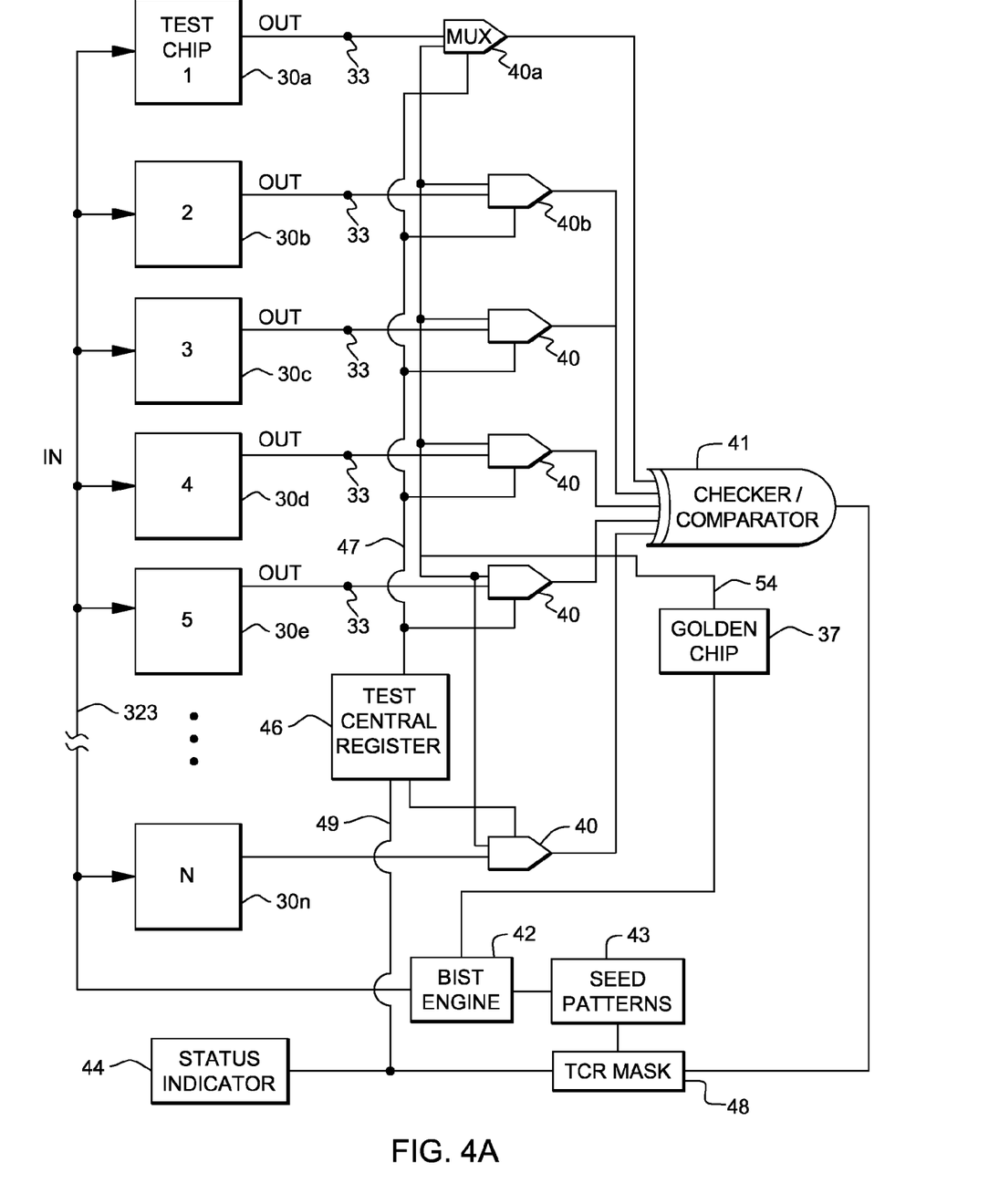
FIG. 4a is a schematic diagram of a chip testing arrangement including more details of the embodiment illustrated in FIG. 3.

Test board 11 is illustrated in greater detail in FIG. 3. More specifically, test board 11 includes sockets into which chips 30 are inserted and control device 31 connected to each of the circuits through lines 32, 33. Chips 30 are typically packaged integrated circuit chips which can be inserted into sockets for providing electrical connection. Control device 31 is shown in more detail in FIG. 4, and includes output MUX 40, checker/comparator 41, test control register 46, test control register mask (TCR) 48, and status indicator 44. While a limited number of chips 30 and sockets are shown in FIG. 3, test board 11 could include any number of chip 30 and sockets.

Figure 4B:
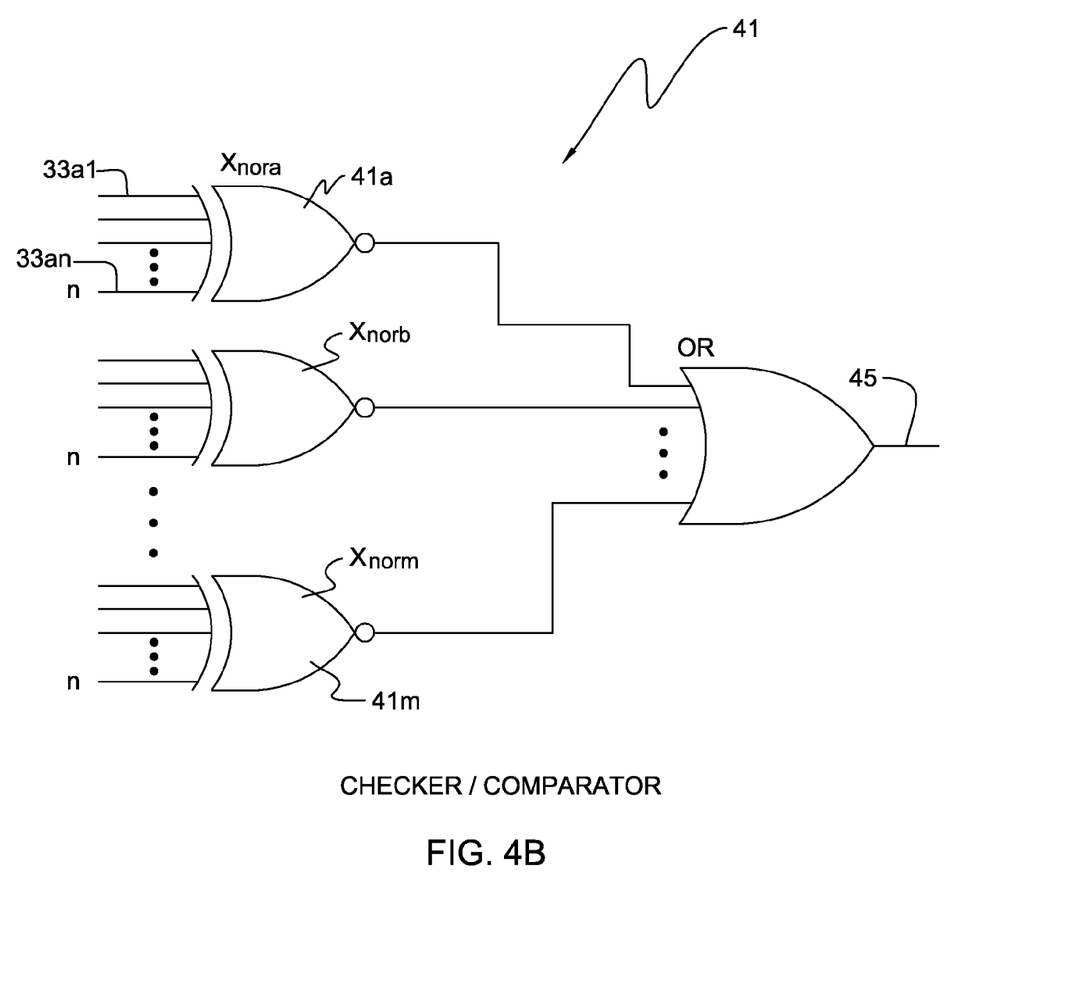

Control device 31 tests all chips 30 connected to test board 11 by applying a signal on line 39 to test stimuli generator 34 which sends the test pattern on lines 32 to the inputs of all chips 30 in parallel. Chips 30 return output signals to control device 31 along individual lines from each chip output that make up line 33. Thus, if each chip has m outputs, line 33 includes m individual lines from each chip. If there are n chips, line 33 includes m×n individual lines. Control device 31 groups signals from each output from all chips and compares these groups of signals in parallel (FIG. 4*b*). If all return signals from corresponding chip output pins are identical, control device 31 reports a pass for that test stimuli and sends a signal to test stimuli generator 34 to send out the next test pattern. When control device 31 detects a difference from the individual lines in output line 33 from each chip 30 then it sets a fail condition in control device 31. It then proceeds to determine which chip is bad. Once determined as a bad chip, the chip is labeled as defective and removed from further testing.

More specifically, in FIG. 3, during the test, each chip under test 30 is supplied with test stimuli from test stimuli generator 34 along signal lines 32, as shown in FIG. 3. Test stimuli generator 34 can be a BIST engine and/or it can be test patterns supplied from a memory source, such as a RAM or a ROM. As a result of the test stimuli, each chip under test will respond on its own individual output lines. The lines from all chips are designated in FIG. 3 as output line 33 which carry test results from corresponding outputs of all chips to controller 31. If every chip is good, then each set of individual lines from corresponding outputs of each chip in output line 33 will have identical values. Control device 31 doing the comparison would find all good chips. If some chips are bad, some values on a line in output line 33 would be different from other signals from corresponding outputs of other chips that arrive in parallel.

In one embodiment, visual indicator 35 is provided for each chip 30, which is connected to the control device 31 by line 36, to indicate to the operator which chips passed and which chips failed during the testing process. Visual indicator 35 can be a light emitting diode (LED), for example. The defective chips could be discarded or returned to the previous processing area (e.g., left on the test board) for evaluation.

FIG. 4(*a*) illustrates more details about test stimuli generator 34 and control device 31 in FIG. 3. Test stimuli generator 34 is a source of test patterns, such as built in self test (BIST) engine 42 and seed patterns 43. Control device 31 includes MUX 40, exclusive NOR (XNOR) checker/comparator 41, golden chip 37, test control register (TCR) mask 48, and status indicator 44. BIST engine 42 uses the seed patterns 43 to produce the test stimuli. The number of XNOR checker/comparators 41*a* to 41*m*, is equal to the number of outputs m each chip has, as shown in FIG. 4*b*. Each XNOR checker/comparator 41*a*-41*m*, is n-way, where n is the number of sockets for holding chips to be tested.

Seed pattern 43 can be stored in ROM or generated by a logic circuit. The output from BIST engine 42 is supplied to each of the chips 30 via input line 32. Outputs "a" from all n chips 30 extend through MUX 40*a* to 40*n* to XNOR 41*a* (FIG. 4*b*) of XNOR 41 along individual lines 33*a* to 33*n* of line 33. Signals along these n lines are checked for matching in XNOR 41*a*. Checker comparator 41 includes all the XNOR gates for corresponding output lines from each chip in line 33 plus an OR gate that passes through any defect information from any of these XNOR outputs, as shown in FIG. 4*b*. The output of checker comparator 41 would be an off state, i.e. zero, if all corresponding outputs on line 33 are the same. If one or more outputs differ, then the output of checker comparator 41 on line 45 is reversed, and goes to an on state, i.e. 1. Thus, the presence of a single defect in data from one output on one chip is determined by the presence of a 1 on line 45.

If output line 45 indicates a fail, then test board 11 includes one or more bad chips. To determine which of chips 30*a* to 30*n* being tested is defective, the following process is used to isolate a bad chip or bad chips and to replace data from that bad chip with known good data from golden chip 37.

Test control register 46 switches MUX 40*a* to turn off signal from chip 30*a* of the array of chips 30. The signal to checker/comparator 41 from chip 30*a* is replaced with signal to MUX 40*a* from golden chip 37 that is provided along line 54 under the control of select line 47 from test control register 46. Since golden chip 37 is guaranteed to provide a passing test result, MUX 40*a* will certainly now generate a passing result. If chip 30*a* was the only defective chip, then all inputs to checker/comparator 41 will now match and line 45 will report a 0 or pass. In that case, chip 30*a* has been identified as the failing chip; it is permanently replaced by golden chip 37 and marked by status indicator 44 and TCR mask 48 as being a bad chip. If line 45 does not go to a pass, then the test control register 46 then switches MUX 40*a* and MUX 40*b* to turn off signal from chips 30*a* and 30*b* of the array of chips 30 and to replace their data with data from golden chip 37. Data to each MUX 40*a* to 40*n* is sequentially replaced with data from golden chip 37 and the test results are re-sampled until output line 45 goes to a pass status. The last MUX, for example MUX 40*e*, which is turned off before the pass status is achieved must have been connected to a defective chip, in this case chip 30*e*. Once failing chip 30*e* has been detected a register bit corresponding to defective chip 30*e* in TCR mask 48 is turned on to permanently identify chip 30*e* as failing. This register bit permanently replaces signal to its MUX 40*e* from that failing chip 30*e* with signal from golden chip 37 and permanently sets the status indicator for chip 30*e* as a fail.

The system allows identification of more than one failing chip. Once the last failing chip has been isolated, line 45 will show passing as described above. Now all previously good isolated chips 30 (those not previously identified as failing in the TCR mask) are reenabled by their corresponding output MUX 40 as controlled by line 47 from test control register 46. The process is repeated to determine whether other chips 30 are failing for the current test stimuli and to identify those chips.

The TCR mask and status indicator 44 are written to keep MUX 40 of a defective chip connected to golden chip 37 through line 49 as described below in FIG. 5. TCR 46 permanently selects golden chip data through that MUX 40 that was connected to the defective chip for the remaining portion of the test using output line 49 from TCR mask 48. From that point on, TCR mask 48 locks the status bit of the defective chip in the status indicator 44. In this manner, as each failing chip is identified, it is isolated, marked, removed from any further testing, and its data replaced by data from golden chip 37.

Thus, while the test is underway, test control register 46 enables MUX 40 with an individual control signal along control signal bus 47 for each of the n chips under test. In this manner, test control register 46 allows the output signals from all chips to propagate to checker/comparator 41 to compare signals with all other test chips. If all the chips pass, meaning that all their corresponding outputs are at the same logic value, the output of the checker 41 would be "pass."

The test results are stored in status indicator 44, which may be a simple array of LEDs or a memory chip which can be queried electronically at the system house. Thus, as with the structure shown in FIG. 3, a visual indicator could identify the defective chips or status indicator 44 could be downloaded to a test computer. The test computer could read onboard status indicator 44 to download the results of the in-transit testing. The good chips would go onto the next stage of assembly, while the bad chips would be discarded or sent back to the chip provider.

In an alternate embodiment, each XNOR checker/comparator 41, is n+1-way, where n is the number of sockets for holding chips to be tested, and the additional input to XNOR checker/comparator 41 comes from golden chip 37. This allows identification of a defect on line 45 even if all chips (except golden chip 37) are defective in exactly the same way.

Figure 5:
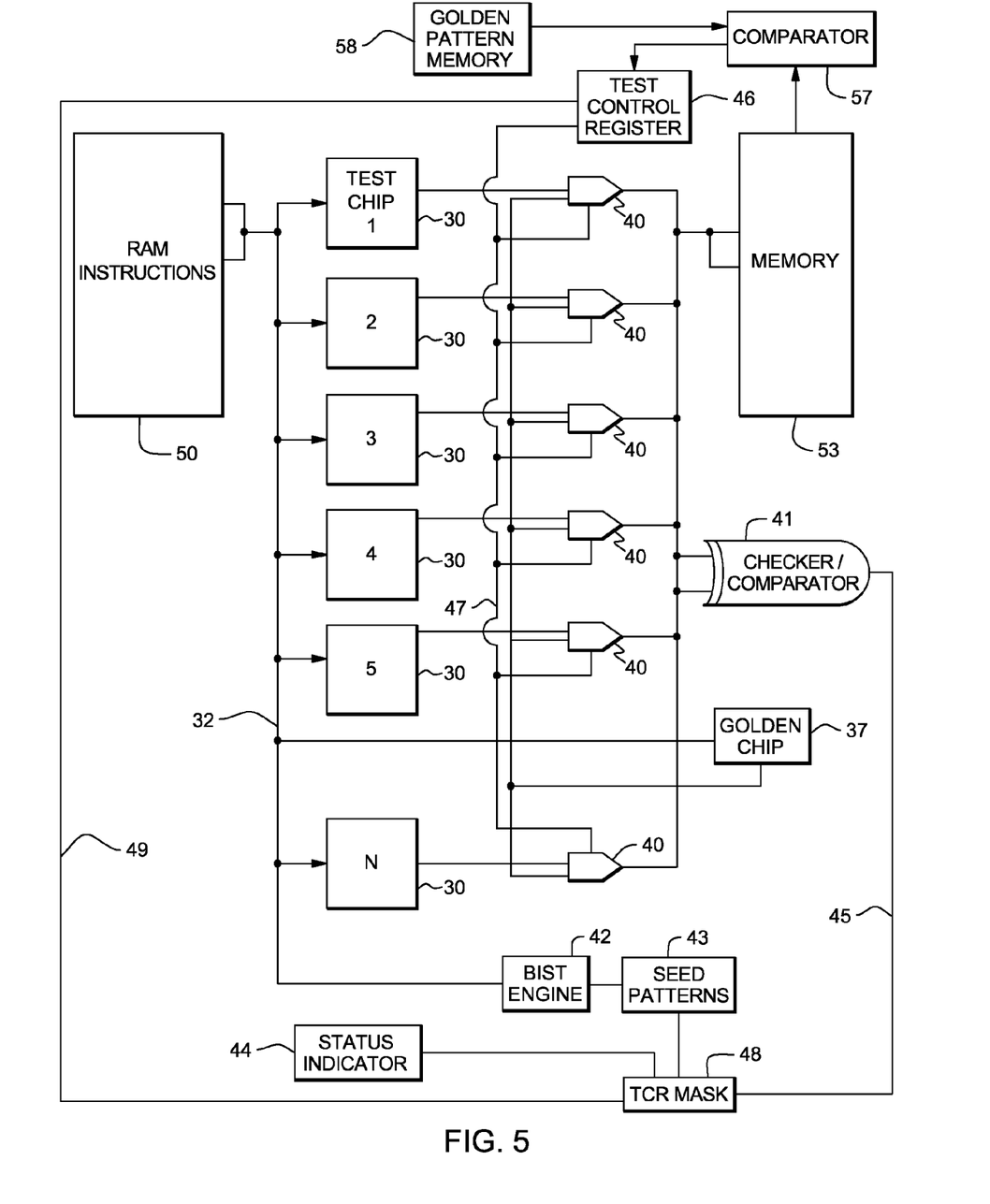
FIG. 5 is a schematic diagram of an alternated embodiment of the chip testing arrangement of FIG. 3.

Additional features that can be added to test board 11 are illustrated in FIG. 5. Instructions stored in memory 50 such as a clock signal or test patterns, etc. are supplied to the chips 30 in addition to (or as an alternative to) patterns from BIST engine 42. Memory 50 can be a RAM, a ROM, or any other storage medium. For example, the product under test may be a microprocessor, and specific product application code stored in memory 50 can be run in addition to patterns generated by BIST engine 42.

During high speed testing, output of all chips 30 can be stored in memory 53. High speed testing is preferably done one chip at a time but can be done in parallel. At any time, test control register 46 could check memory 53 using comparator 57 to compare test data stored in memory 53 with golden data stored in golden pattern memory 58. Golden data in golden pattern memory 58 was generated from previous controlled experimental testing, from simulation, or directly from golden chip 37 during testing. If the contents of memory 53 are different than the contents of golden memory 58, the process described above using golden chip 37 is used to determine which chip is defective. Once a failing chip is isolated, it is removed from further testing, and marked as a fail.

In addition to providing for testing during transport, the invention saves test time by providing parallel testing of chips at wafer-test or at module test within the factory. For wafer test, a test fixture, such as those known in the art for multi-die testing or for wafer-level burn-in, can be provided that contacts a large number of chips or all chips on the wafer simultaneously. The circuit described herein above is provided locally to the wafer on that test fixture or wafer interface board. Thus, by providing the golden signal for compare local to the chips being tested the number of tester channels needed for multiple chip testing is sharply reduced. Preferably that golden output signal is provided by a golden chip running simultaneously with the chips under test. It can also be provided from memory connected to the wafer or module test board. By providing a local compare all outputs of each chip can be measured, a significant advantage over testers that reduce pin count to each chip to limit the number of tester channels.

Figure 6:
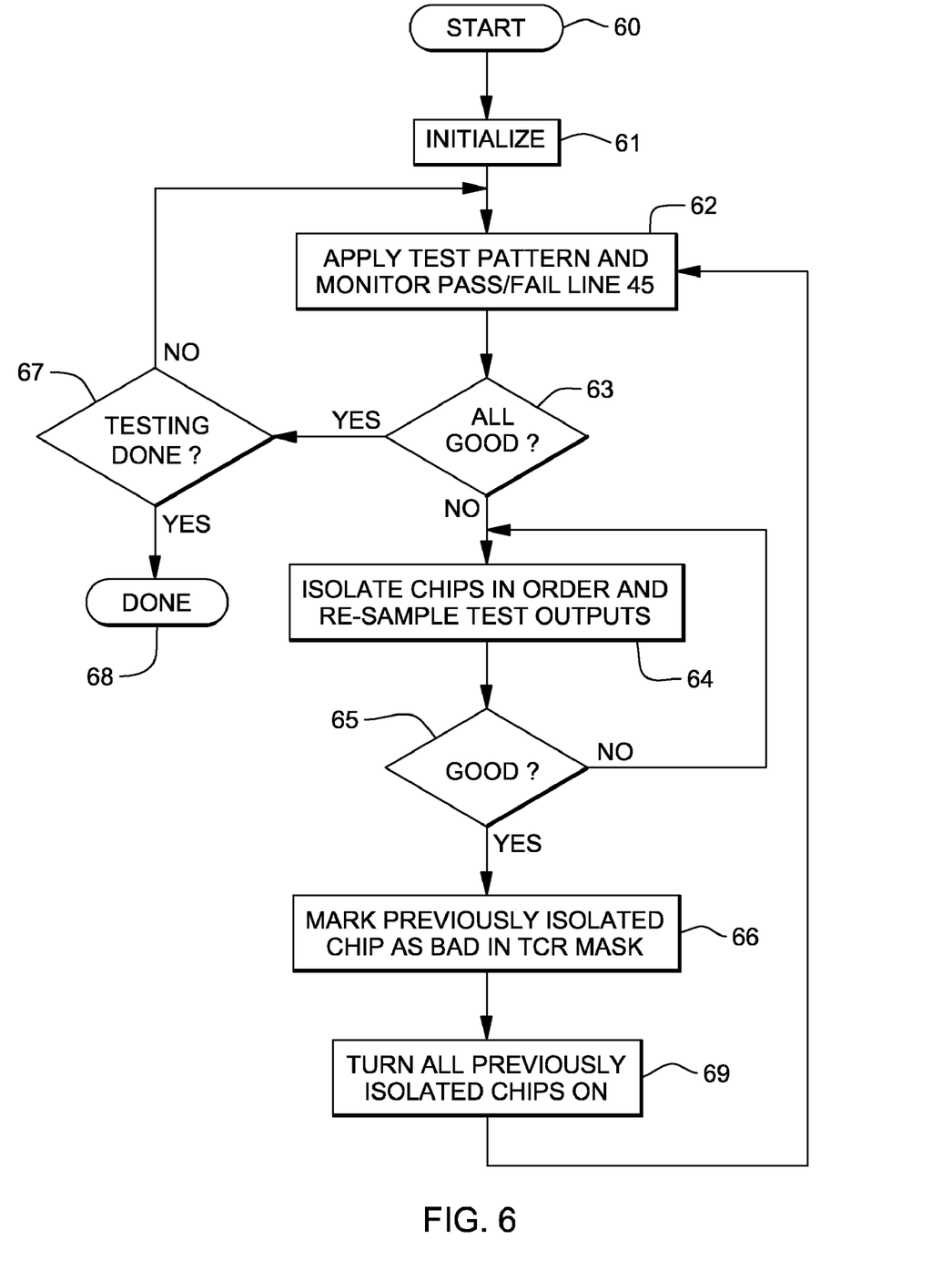
FIG. 6 is a flowchart representation of the invention.

FIG. 6 is a flowchart illustrating an embodiment of the invention. Block 60 represents the start of the process. The status indicator is initialized to indicate that all chips are good in block 61. Test patterns from test stimuli generator 34, RAM 50 and/or BIST engine 42 are applied to chips 30 in block 62. Checker/comparator 41 monitors the signal returned from test chips 30 and defects found on line 45 are noted in status indicator 44, as shown in block 62. Whether all chips passed or not, the state of line 45 is determined in block 63. If they did not all pass, the failing chip is isolated and its data is replaced by data from golden chip 37 by sequentially replacing connection in MUX 40 from its chip with connection to golden chip 37, as shown in block 64. As each MUX is disconnected from its chip, and the defective signal continues to be present, block 65 will return the process to isolate the next chip by sequentially disconnecting connection in the next MUX to its chip, as shown in the no response to block 65. When disconnecting MUX 40 from its chip finally produces a passing signal, the status indicator 44, TCR mask 48, and/or LED 35 record the previously isolated chip as defective, as shown in item 66. All other isolated chips are then turned on again in block 69 and the process resumes at block 62 with application of patterns and monitoring of pass/fail line 45. If all chips are now good, in block 63, whether or not additional test patterns should be applied is determined in block 67. If so, they are applied in block 62. If not processing is completed, and the flowchart terminates at block 68.

As mentioned above, each batch of ASIC chips has potentially different performance parameters from other batches of ASIC chips. This presents special testing problems to conventional systems, because the proper output for each different batch of ASIC chips must be known before the chips can be properly tested. However, with the invention since the chips are merely tested against other chips in the same batch to determine if similar output signals are produced, the invention does not need to know the specific output a given input should produce. This is true whether the chips are tested against other untested neighboring chips or also tested against a known good "golden" chip.

Figure 7:
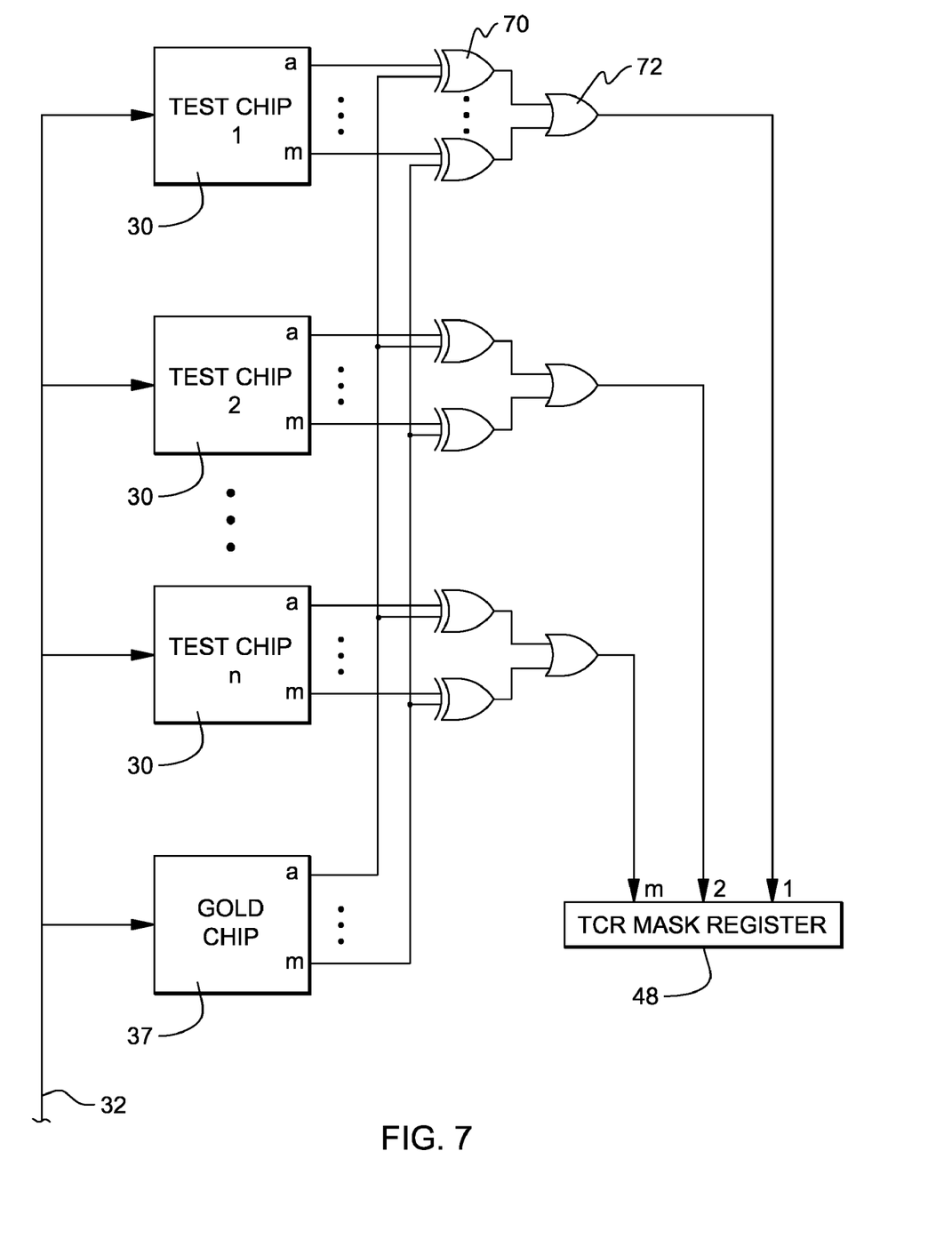
FIG. 7 is a schematic diagram of an alternate chip testing arrangement wherein outputs of all chips are simultaneously compared with outputs of a golden chip.

In an alternate embodiment, all chips under test 30 and golden chip 37 are simultaneously provided with the test signal along line 32 as shown in FIG. 7. For each chip under test 30 all m output signals are simultaneously compared with m corresponding output signals of golden chip 37. An array of m 2-way XNOR comparators 70 is used for the comparison for each of the n chips. The m outputs of the comparators 70 for each chip are combined in OR gate 72 to determine whether any output of chip 30 failed the test. If so that chip is identified as a fail by setting TCR mask 48, as described herein above. If a chip is identified as a fail in any test, the TCR mask is not reset in subsequent testing and remains a fail. A similar scheme can be used at wafer test.

The invention allows testing to be performed during transportation by using test box 10 and self-powered in-transit box 20, as discussed above. When a chip is determined to be bad, that information can be maintained in status indicator 44 which can be downloaded and viewed when in-transit box 20 arrives at its location. Alternatively, the chips or test board may provide a visual indication (such as an indicator light 35) of test failure. These test LEDs 35 are placed next to each test chip 30 (FIG. 3) and are turned on when a failing chip is identified and removed from further testing. Failing chips would thereby be easily visible.

In operation, after the chips are manufactured in the foundry, they could be mounted on test board 11 and tested during transportation (e.g., on the way to the system house). The chips which were determined to be good, would be removed for assembly, while chips which were determined to be bad could be returned to the foundry (or some other location) in in-transit box 20. This would allow diagnostics to be performed to determine the source of the defect.

Therefore, the invention provides a substantially simplified system for testing ASIC chips by not having to know the output a given input should produce. This is especially important in ASIC chip testing because each different batch of ASIC chips has a potentially different output for a given input. Further, since the invention tests the chips during transit, the testing time does not add to the manufacturing time (assuming that the transportation time is longer than the testing time). Thus, the invention helps speed ASIC chip products to market by simplifying the testing process (and thereby reducing testing time) and by performing the testing during transit to further reduce overall processing time.

The invention provides the benefit of eliminating chip tests at the receiving site because the parts are tested during the transit stage. Upon unpacking the chips, only fully tested/passing chips would be used for the next phase of card assembly.

Further, with the invention, more test patterns can be applied than would be allowed during the normal manufacturing process. Currently, the test time for each chip cannot be long, since the parts need to be shipped to the customer as soon as possible. However, since testing is now done in transit which can be hours (or even days), more chip test time is available, so many more patterns can be applied and test coverage correspondingly increased. Also different temperature/voltage combinations may be used, so that once the parts reach the final destination, the modules have had far more rigorous testing. This results in higher reliability, reduces in house manufacturing test time and reduces the overall cost by reducing the need for manufacturing testers.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method for simultaneously transporting and testing integrated circuit chips comprising:
    connecting integrated circuit chips to test boards having test circuitry;
    mounting said test boards in test boxes having power supplies;
    mounting said test boxes in an in-transit box;
    transporting said integrated circuit chips in said in-transit box;
    testing said integrated circuit chips during said transporting by using said test circuitry; and
    supplying power to said integrated circuit chips during said transporting and said testing by using said power supplies.

2. The method in claim 1, all the limitations of which are incorporated herein by reference, further comprising identifying ones of said integrated circuit chips which failed said testing.

3. The method in claim 2, all the limitations of which are incorporated herein by reference, wherein said identifying comprises storing results of said testing in a memory.

4. The method in claim 2, all the limitations of which are incorporated herein by reference, wherein said identifying comprises displaying a visual indicator of passing or failing chips.

5. The method in claim 2, all the limitations of which are incorporated herein by reference, wherein said testing includes comparing output signals of said integrated circuit chips with each other.

6. The method in claim 1, wherein said testing includes comparing output signals of one integrated circuit chip with output signals of all other integrated circuit chips that have not been identified as defective.

7. The method in claim 1, all the limitations of which are incorporated herein by reference, wherein said testing includes comparing output signals of said integrated circuit chips with a golden chip.

\* \* \* \* \*